United States Patent [19]

Hamilton et al.

[11] Patent Number: 5,200,885
[45] Date of Patent: Apr. 6, 1993

[54] DOUBLE BURN-IN BOARD ASSEMBLY

[75] Inventors: Harold E. Hamilton, Minneapolis; Charles M. Hicks, Circle Pines, both of Minn.

[73] Assignee: Micro Control Company, Minneapolis, Minn.

[21] Appl. No.: 513,997

[22] Filed: Apr. 26, 1990

[51] Int. Cl.$^5$ .................. H01R 23/72; H01R 9/09
[52] U.S. Cl. ..................... 361/413; 211/41; 324/158 F; 324/158 R; 361/397; 361/412; 361/415; 439/64; 439/61; 439/74
[58] Field of Search ............ 361/412, 413, 415, 393, 361/396, 392; 324/158 F, 158 R; 439/72, 268, 159, 68, 331, 525, 44, 45, 47, 50, 65, 69, 74, 61, 62, 64; 211/41

[56] References Cited

U.S. PATENT DOCUMENTS

| | | | |
|---|---|---|---|
| 3,794,954 | 2/1974 | Reimer | 439/74 |
| 4,094,568 | 6/1978 | Lee et al. | 439/74 |
| 4,432,604 | 2/1984 | Schwab | 439/74 |
| 4,730,232 | 3/1988 | Lindberg | 361/392 |
| 4,799,021 | 1/1989 | Cozzi | 324/158 |
| 4,900,948 | 2/1990 | Hamilton | 307/149 |
| 4,998,180 | 3/1991 | McAuliffe et al. | 361/413 |

FOREIGN PATENT DOCUMENTS

| | | | |
|---|---|---|---|
| 1149420 | 5/1963 | Fed. Rep. of Germany | 361/415 |
| 3335110 | 9/1983 | Fed. Rep. of Germany | 361/415 |
| 1206341 | 9/1970 | United Kingdom | 361/413 |

OTHER PUBLICATIONS

IBM Technical Disclosure Bulletin, "Electronic Page Assembly", W. S. Damari, vol. 13, No. 7, Dec. 1970.

Primary Examiner—Leo P. Picard
Assistant Examiner—Donald Sparks
Attorney, Agent, or Firm—Kinney & Lange

[57] ABSTRACT

A pair of mother burn-in boards are placed back to back, and are adequately supported with respect to each other to form an assembly. Each of the boards supports a nose board or connector board so that two sets of connectors are available for conductors and sockets on the exposed sides of the mother boards. The conductors on the two burn-in boards are connected in parallel to permit using test signals from each connector on the nose board for a socket on each of the mother burn-in boards. The assembly is made to be rigid, reliable, and to provide a wide ability to adapt components for mounting on available standard burn-in socket packages to increase the number of components that can be simultaneously tested.

8 Claims, 6 Drawing Sheets

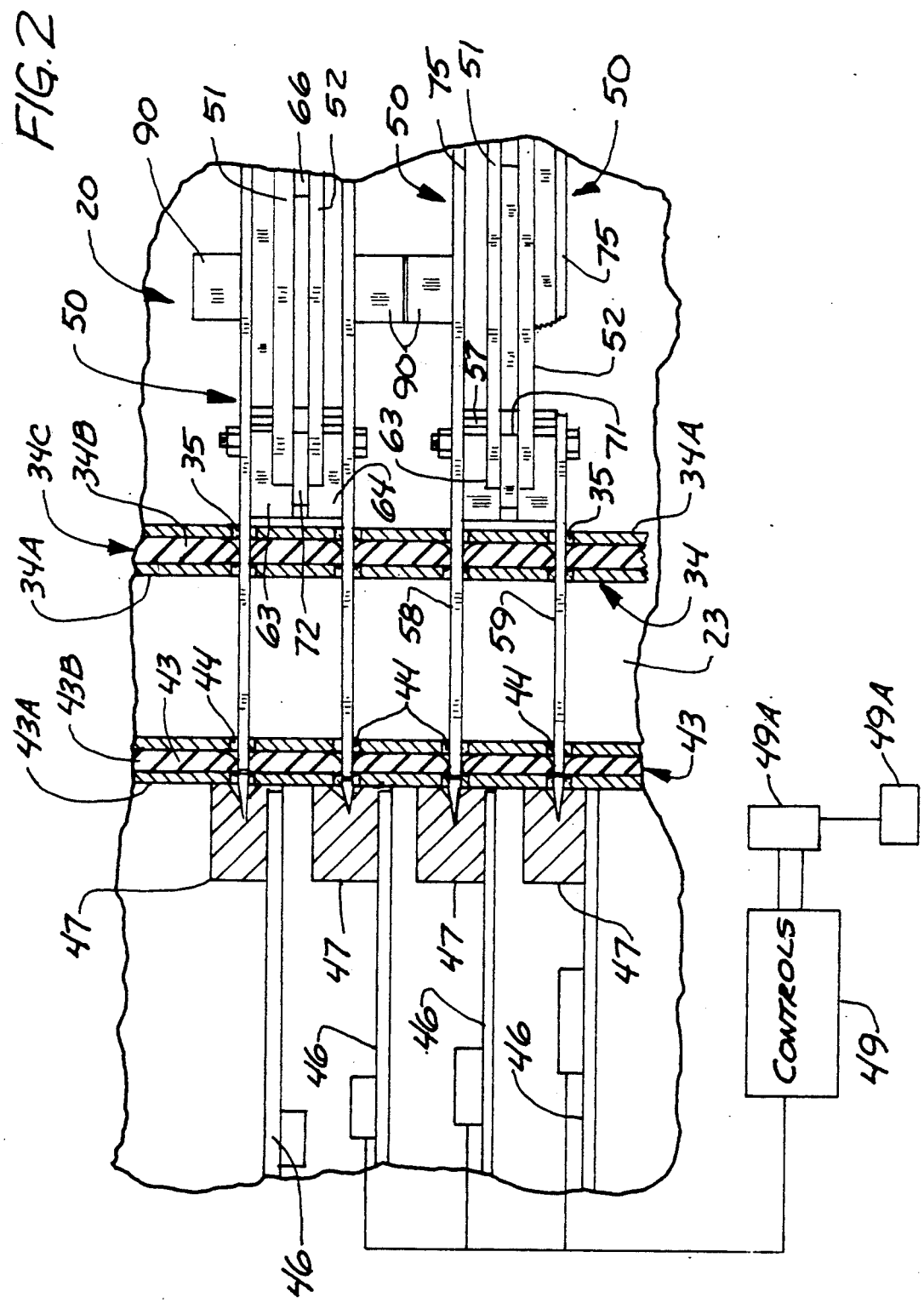

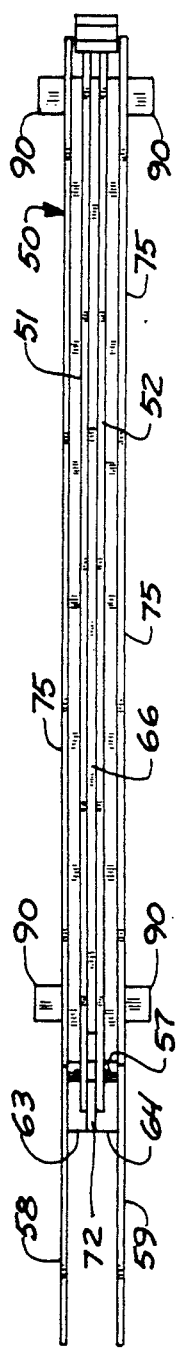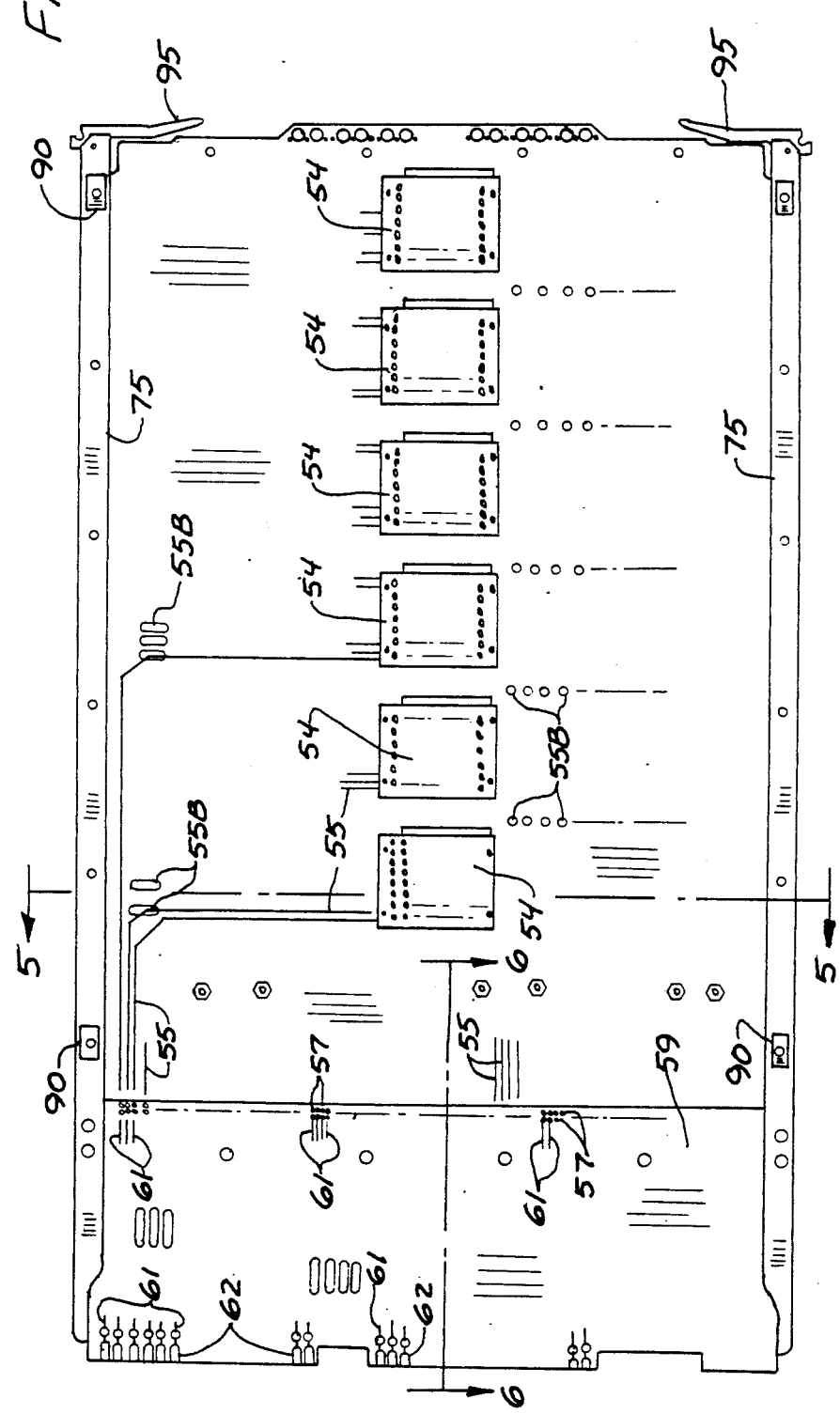

DOUBLE BURN-IN BOARD ASSEMBLY

BACKGROUND OF THE INVENTION

The present invention relates to a double burn-in board assembly for use in conventional environmental ovens for dynamic burn-in, which permits connecting a large number of components in a desired manner for burn-in purposes by providing the availability of double the amount of burn-in socket sets and with corresponding components on each board connected in parallel with the components on the other board. The connector nose boards together have a sufficient number of connectors for driver/receiver boards to permit a wide variety of input using standard connectors.

U.S. Pat. No. 4,900,948, issued Feb. 13, 1990, illustrates a device for providing signals for burn-in of integrated circuits. The device shown in that patent illustrates a single burn-in board that has a pair of nose boards attached to the single board permitting a large number of connections to components on such burn-in board. The present invention provides a rigid assembly of two complete mother burn-in boards attached to a pair of nose boards, for connection to existing driver/receiver boards which are used for providing the desired tests to components in a environmental burn-in chamber, usually at an elevated temperature.

The socket bases on each mother burn-in board hold a substantial number of individual components for testing. The parallel connections between the mother boards, with an adequate number of connections by using two nose boards, permits testing the number of components that can be mounted on the double board assembly.

SUMMARY OF THE INVENTION

The present invention relates to an assembly of two burn-in boards that are placed back to back, each of which has a plurality of socket bases for mounting a substantial number of individual components for use in a burn-in sequence in an environmental chamber. Each of the boards has a nose board thereon which passes through a temperate zone to contacts to permit connection from the digital devices mounted in the socket bases on the burn-in boards to driver/receiver boards of standard design located outside the environmental chamber. The burn-in socket bases are standard components that are used on burn-in board assemblies at the present time, and each of the socket has over 300 socket holes for mounting devices for test. The sockets are each connected to edge connectors or pads on each of the mother burn-in boards. The mother boards are placed back to back, and preferably are made so that in the assembly, the edge connectors of the mother boards are aligned with corresponding connectors and conductors of the other mother burn-in board.

Each of the edge connectors are electrically connected to conductors on the nose boards, which have outer edge connectors used for connecting to standard driver/receiver board sockets. The edge connectors of each mother burn-in board are also connected to corresponding connectors on the other mother burn-in board. In this manner, test signals from one nose board can be provided to corresponding components on both of the mother burn-in boards, and by electrically connecting each of the individual conductors on one of the burn-in boards to corresponding conductors on the other burn-in board having two nose boards for providing connections to both of the mother burn-in boards permits doubling the amount of components that can be tested on one board assembly or module because the signals from both of the nose boards can be fed to each of the mother boards.

The edge connectors formed gold plated contact pads, and the edge connectors also are connected to pin sockets so that pins can be used for transferring electrical signals from one of the mother burn-in boards to the other and from the mother burn-in boards to the associated nose board. Further power connections between the boards are made through the screws and spacers that hold the boards in the assembly. The burn-in mother boards are fully supported at their edges for a very rigid, rugged assembly.

BRIEF DESCRIPTION OF THE DRAWINGS

FIG. 2 is a fragmentary enlarged plan view of the two burn-in boards mounted together, with the nose board shown passing through typical environmental chamber walls and into the connectors for the driver/receiver boards used in the standard manner;

FIG. 3 is a top view of a double burn-in board assembly according to the present invention;

FIG. 4 is a side elevational view of the double burn-in board assembly of FIG. 3;

DETAILED DESCRIPTION OF THE PREFERRED EMBODIMENTS

Figure 1:
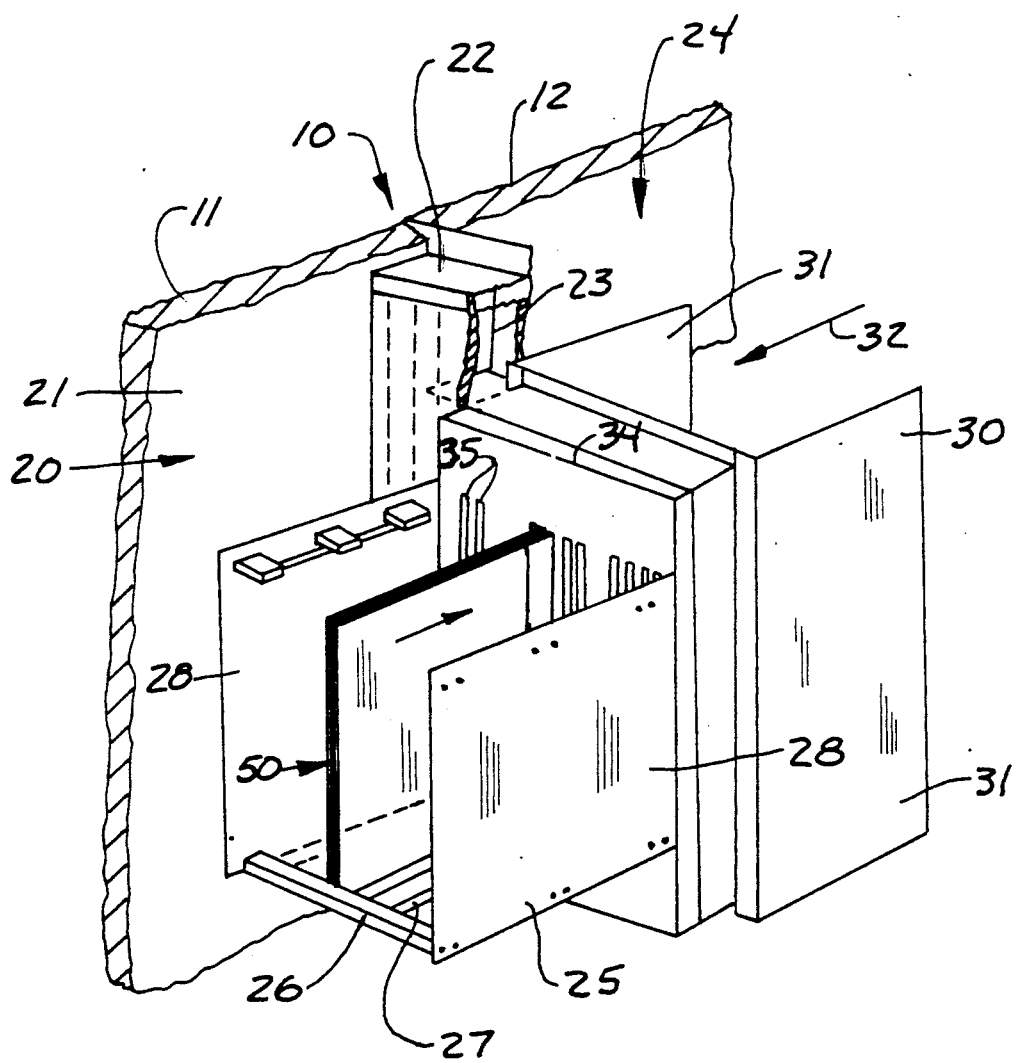
FIG. 1 is a fragmentary perspective view of a typical board rack used in an environmental chamber and which will receive and hold a double mother burn-in board assembly made according to the present invention.
Figure 5:
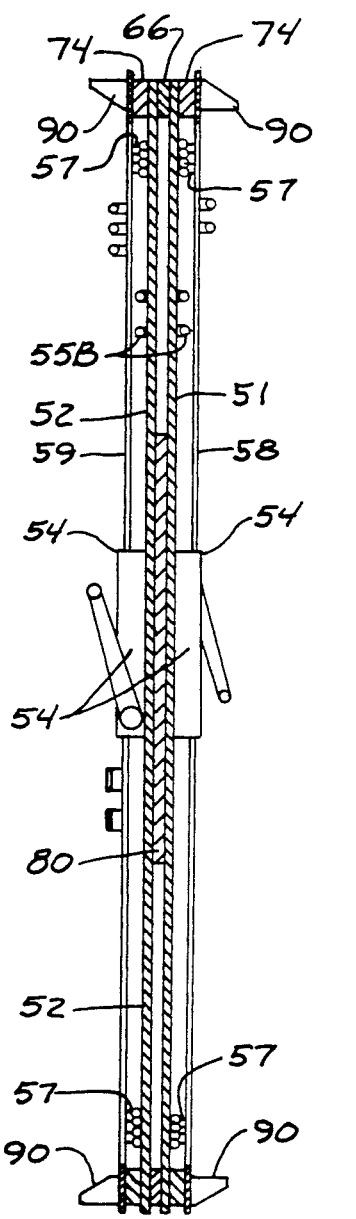
FIG. 5 is a sectional view taken as on line 5—5 in FIG. 4.

FIG. 1 is a schematic illustration of a burn-in board chamber and loading chamber. The burn-in environmental chamber is indicated generally at 10, is shown with exterior wall broken away except for wall 21 that defines a portion of the heated environmental chamber housing 11. The environmental chamber housing encloses the chamber 10, and is surrounded by the walls arranged in the desired manner. At the end of the interior chamber 20 opposite from a loading door (not shown) a housing 22 is positioned. Housing 22 as shown forms a temperate zone or chamber 23 that separates the heated environmental chamber 20 from the driver/receiver board chamber 24 of a load chamber housing 12. This is a conventional arrangement, as shown in U.S. Pat. No. 4,900,948, and the driver/receiver boards are conventionally used and mounted in a separate chamber. The driver/receiver boards provide the test sequences to the components and are connected across the temperate zone to burn-in boards inside the environmental chamber 20.

The schematic showing includes a burn-in board support rack indicated generally at 25 (which is also called a card cage) and this is within the interior environmental chamber 20. The rack 25 has a bottom wall 26 and suitable guide members shown at 27 therein for receiving the edges of burn-in boards or, if desired, for receiving separate loading racks holding several burn-in boards. As shown, the double burn-in board assembly 50 of the present invention can be slid into these racks and held in suitable position.

The temperate zone housing 22, as can be seen in FIG. 2, is defined by an end environmental chamber wall 34 that has slots 35 therein which are of size to receive the connecting portions of the burn-in board assemblies, and as schematically shown, the wall 34 can have a sealing center member 34B sandwiched between slotted plates 34A.

A rear wall of the temperate zone is shown at 43, and includes slots 44 through which the connector boards, as will be shown, can easily be passed as well, and these will then fit into connectors 47 that are schematically shown only but which provide for connections to driver/receiver boards indicated at 46. These again are conventional connectors that provide for individual connections to each of the edge connectors or pads on the burn-in boards. The driver/receiver are controlled by conventional controls 49 that may be programmed from a microprocessor and keyboards as shown at 49A.

The environmental chamber will support and house a double burn-in board assembly or module indicated schematically at 50 for burn-in of digital components. The burn-in board assembly 50 includes a first mother burn-in board 51, and a second mother burn-in board 52. The mother burn-in boards are printed circuit boards of suitable insulating material having conductor circuit paths thereon, and each of which mounts a plurality of burn-in sockets indicated generally at 54 on one side surface thereof. The burn-in sockets 54 are conventional blocks or pads having a large number of pin socket holes (350 or so) that are used for placing digital devices that are to be tested thereon, in a conventional manner. Each of the socket openings on the burn-in sockets 54 is individually connected to conductors such as those schematically shown at 55, on the burn-in boards and in turn these conductors are connected to edge pads or connectors 56 that are relatively narrow and elongated strips of conductor right at the edge of the mother burn-in boards and folded around the edge, so that the inner surfaces of the mother burn-in boards have pad portions 56A on the inner sides. Each conductor 55 on the mother burn-in boards has a connected socket at the connector edge which receives a pin connector 57 for connecting to conductors 61 on nose boards or auxiliary boards indicated at 58 and 59, respectively, each of which is attached to one of the mother burn-in boards 51 and 52. Typical conductors and components 55B are shown only schematically on the mother burn-in board, for illustrative purposes, and generally the mother boards support resistors and other components as needed for the tests. Only a few components are illustrated.

The desired connector pads or edge connectors 56 and associated conductor on each of the mother burn-in boards 51 and 52 is connected to a corresponding conductor 61 and associated edge connector or pad 62 on one of the respective nose boards supported on the respective mother board. The pads 62 on the nose boards are connected to the circuits carried by the driver/receiver boards 47 through the socket connectors 46. The nose boards also have components 61A, such as resistors mounted thereon as needed. Only a few components are shown for clarity.

The nose boards 58 and 59 are secured to the mother boards 51 and 52, respectively, through the use of vertical support spacer columns 63 and 64, respectively. The pin connectors 57 between the connection 56 and conductors 55 and the respective conductors on the burn-in boards are spaced from these spacer columns so they are not shorted to the spacers.

Figure 6:
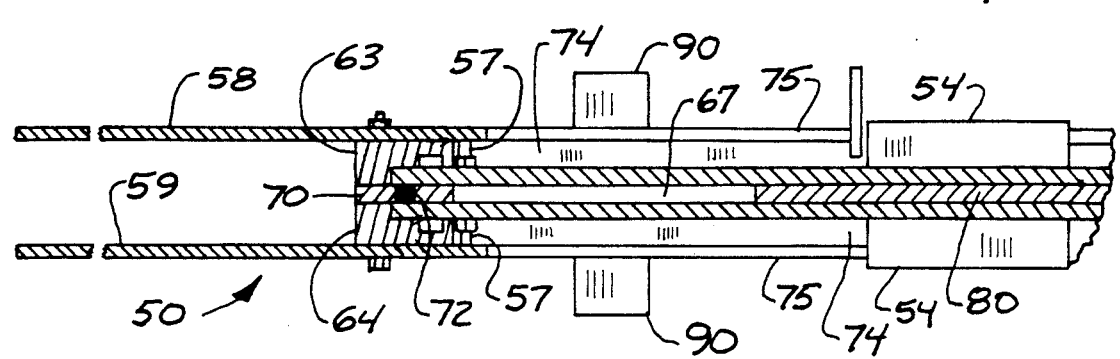
FIG. 6 is an enlarged fragmentary sectional view taken on line 6—6 of FIG. 4.
Figure 7:
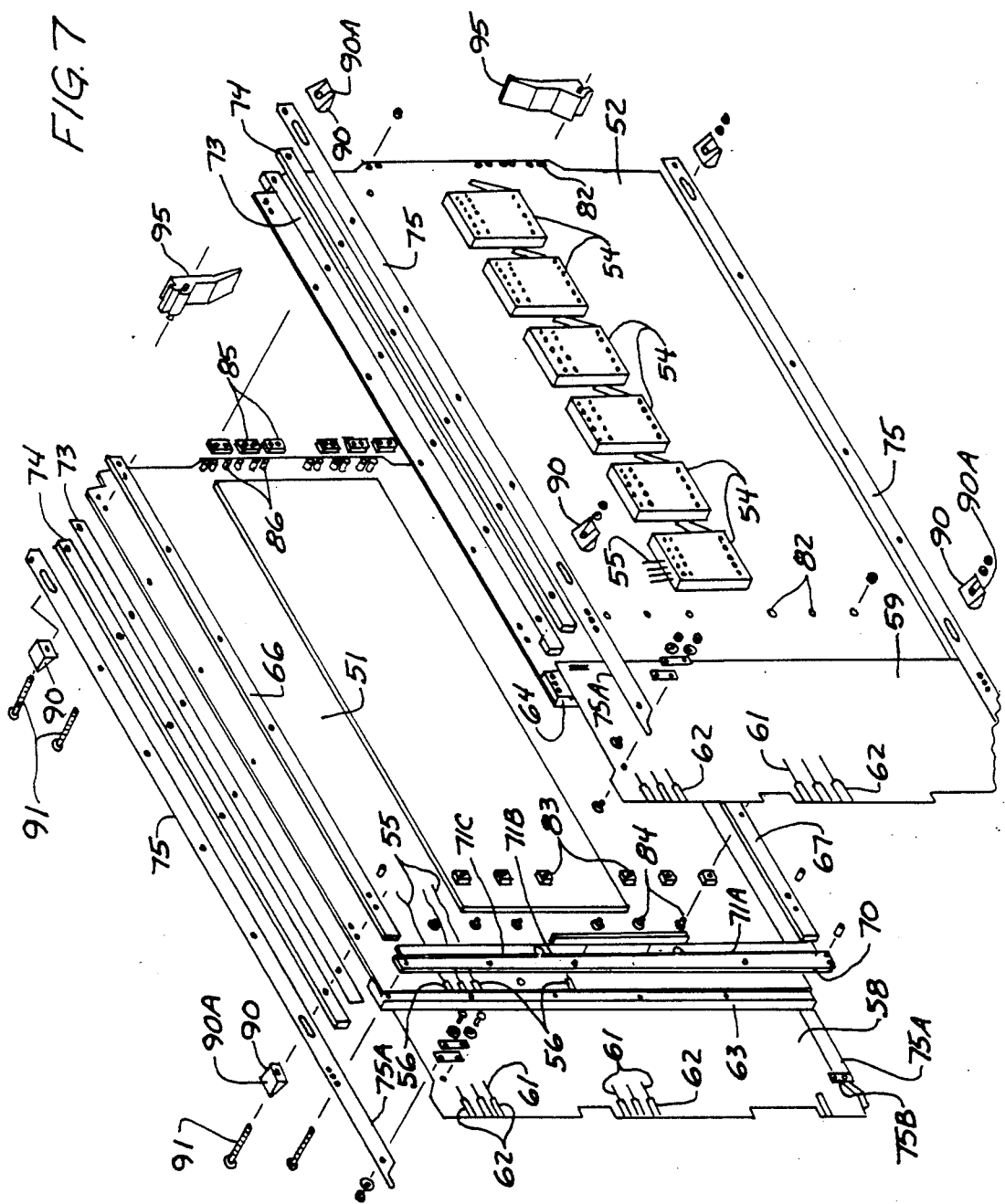
FIG. 7 is an exploded perspective view of a double mother burn-in board assembly made according to the present invention.
Figure 9:
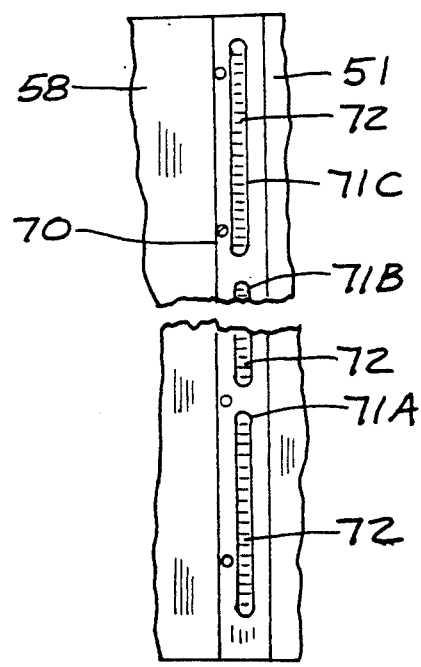
FIG. 9 is a side view of a spacer bar at the contact end of the mother burn-in boards with parts in section and parts broken away.

The mother burn-in boards 51 and 52 are held back to back, and parallel with the back surface 51A of mother board 51 facing the back surface of mother board 52. The mother burn-in boards are spaced apart through the use of spacer strips at the top and bottom of the boards, including a top spacer 66 between the mother burn-in boards and a corresponding bottom spacer 67 (FIG. 6) at the lower edge of the mother burn-in boards. The mother boards are actually inverted from each other so only one basic board design is needed. That is the lower edge of mother burn-in board 52 is the same as the upper edge of mother burn-in board 51, and vice versa. The burn-in boards 51 and 52 at the end where the nose boards 58 and 59 are connected, are spaced apart with a suitable elongated rigid upright spacer 70, which is specially made and has longitudinal slots 71A, 71B, and 71C therein. The slots 71A, 71B and 71C are made to support resilient elastomeric and gold wire connector strips indicated at 72 (see FIG. 9) to provide for a compressible connector from the contacts 56 on the backside 51A of mother board 51 to the contacts or pads 56 on the facing backside of the mother board 52. The connectors 72 provide several very small individually insulated tubes of gold for conduction from each of the individual pads or contacts 56 on one mother board to electrically connect the aligned contact or pad 56 on the opposite mother board in parallel.

The contacts or pads 56 are clustered in groups so the space between the slots 71A, 71B and 71C is not aligned with any connectors or pads. The strip connectors 72 are commercially available, and are slightly compressible inasmuch as the gold wire connectors are carried in an insulating elastomeric material so that when the two mother burn-in boards of the board assembly 50 are clamped together, there will be pressure on the connectors to ensure a good electrical connection between a connector or pad 56 on one mother board to an aligning connector or pad on the other mother board, but yet the connector wires that carry the electrical signals between the two mother burn-in boards 51 and 52 are insulated from the spacer 70. Spacer 70 is a metal spacer, to provide adequate support. Insulating spacer strips or layers can be provided on the sides of spacer 70 to insulate the edges of the mother burn-in boards resting on the spacers. Alternatively, each of the conductors on one mother burn-in board can be connected by a pin to the corresponding conductor on the other mother board (see FIG. 10). The corresponding conductors on the mother boards are then connected in parallel.

Suitable insulation strips indicated at 73 are provided at the top and bottom edges of the mother boards, to prevent an outer longitudinal spacer 74 on each of the mother burn-in boards from shorting against circuits on such mother board. Outer longitudinal spacers 74 at both the top and bottom of the burn-in board assembly 50 provide fillers equal to the thickness of the portion of vertical spacers 63 and 64 that rest on the exterior of each mother board. The insulation strips 73 can be of any desired width and/or number to ensure that there is adequate insulation. A guide rail 75 is positioned on the outline of each spacer 74 at both the top and the bottom of the board assembly. The guide rails 75, as can be seen in FIG. 3, have edge portions which extend beyond the edges of the mother boards and spacers 74. The edges of guide rails 75 provide sliding guide rails for slipping the double board assembly 50 into a card rack when it is going to be placed into an environmental chamber.

An insulation pad 80 of suitable silicone sponge material is placed between the mother burn-in boards 51 and 52 to keep them spaced apart in their center portions and to provide insulation in the desired areas.

Additionally, the mother boards have plated through eyelets indicated at 82 thereon that form power connections. These power connections are carried between the mother burn-in boards through the use of metallic spacer conductors 83 and screws 84 that pass through the eyelets 82 on the respective mother burn-in boards and hold the boards together and also carry high current electric power.

At the edge of the mother boards 51 and 52 remote from the nose boards, conductive spacers 85 are provided, and these are also made with openings through which screws 86 can pass for holding the edges of the mother boards together. The screws 86 also pass through plated eyelets in the boards.

The assembly of the mother burn-in boards is made with the spacers 66 and 67 at the top and bottom, and then placing the insulation strips 73, the outer spacer 74, and the guide rails 75 in position. Guide rails 75 extend out beyond the edges of the mother boards and overlie the nose boards at the ends indicated at 75A, at both the top and bottom of the double burn-in board assembly 50. Straps 75B can be used to support the nose boards relative to rails 75. The mother burn-in boards are assembled together with suitable screws passing through openings in the edge spacers 63 and 64, sandwiching in the edge spacer 70 and making the contacts between the conductors on the two mother burn-in boards through the use of the elastomeric connector strips 72 that fit into slots 71A, 71B, and 71C.

Figure 8:
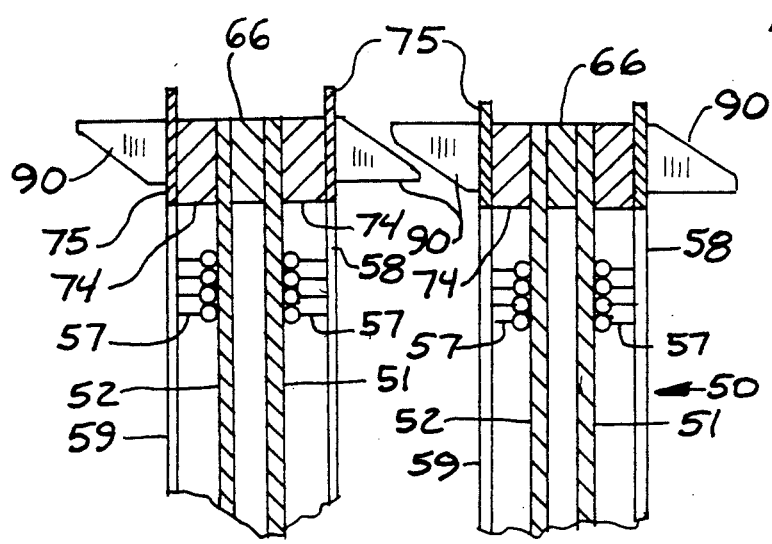
FIG. 8 is a sectional view taken on line 8—8 in FIG. 2.

At the upper and lower edges of the board assembly 50, there are laterally extending legs 90 on each side of the assembly. The legs 90 are held in place with suitable screws 91. The legs 90 protrude laterally outwardly from the board sides so that they will provide protection for the burn-in sockets 54 and components on the sockets, as well as other components mounted on the mother burn-in boards when the board assembly is laid on its side. The legs support the board while one face is layed down to load components into the burn-in sockets on the other mother board. The legs avoid damaging the components. These legs, as shown, are generally triangular shaped and are shown, are generally triangular shaped and are complimentary, so that the legs protruding from the board 51 have flat surface on the upper sides, and a tapered surface on the lower side and the legs protruding from the board 52 have flat surfaces on the lower side. This permits the legs to slide past each other when two of the double burn-in boards are placed into an environmental chamber, as shown in FIGS. 2 and 8. The sloping edge surfaces of the triangle, that is the hypothenuse surfaces of the triangle shape of the two legs slide past each other, while providing an outer edge end 90A that will be a support in use when the board apparently is laid on its side.

Extractor levers such as that indicated at 95 can be used. These are conventional devices to aid in installing and removing the burn-in boards from environmental chambers. They react against portions of the chamber to provide leverage for removal or insertion.

Figure 10:
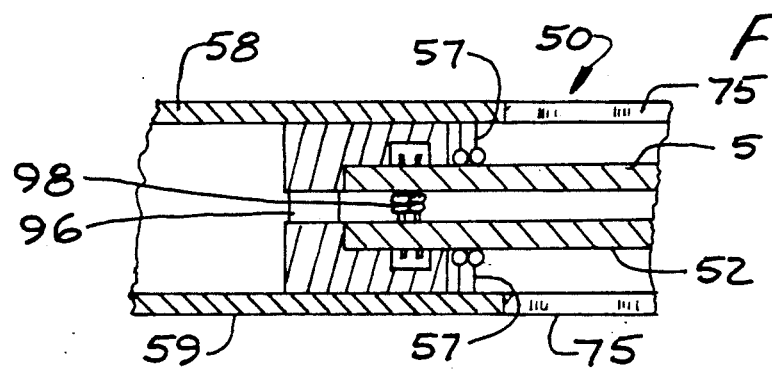
FIG. 10 is a sectional view similar to FIG. 5 illustrating a modified form of connecting the conductors on mother burn-in boards in parallel.

FIG. 10 shows a modified form of connecting the conductor pads 56 on the mother boards together in parallel. In this form of the invention, as shown, the double burn-in board assembly 50 is modified to the extent that a plurality of vertical pin and socket connectors, indicated generally at 98, are connected between each of the corresponding connector pads on the two mother burn-in boards 51 and 52, which are shown in section. These connectors 98 are soldered in place in a conventional manner, and the spacer bar 70 is replaced with a suitable spacer 96, which can be of any desired construction.

The rest of the construction is the same, including the pin connectors 57 between the mother burn-in boards 51 and 52, and the respective attached nose boards 58 and 59.

Thus, the double burn-in board assembly provides a very rigid structure, of two burn-in boards, and two nose boards or connector boards to provide a large number of contacts for connection to the driver/receiver boards. The conductors on each of the mother burn-in boards are connected in parallel to the conductor on the other mother burn-in board. The contacts on each nose board are connected to half of the conductor on its associated mother board. The connectors on nose board 58 are connected to different mother board conductors than the connectors on nose board 59. The parallel connection of the conductors on the mother boards makes the signals on each nose board connector and are thus provided to both mother burn-in boards. Thus double the number of components can be placed onto the burn-in sockets 54 of the board assembly 50 over a single board as shown in U.S. Pat. No. 4,900,948. In a typical example, 288 connections are provided by the nose boards for coupling to conductors of both mother burn-in boards. The parallel connected, rigidly supported double burn-in board assembly, having the two nose boards for connection to the driver/receiver sockets, greatly increases capacity for testing.

Further, the power connections can be handled through large conductors between the mother burn-in boards rather than very fine connectors, so that the power is adequately carried to the respective boards.

The edge connectors 56 can be connected to small plated pin hole sockets for each of the leads or circuit paths leading to such connector, and then connector pins can be used for joining the circuits on the two mother burn-in boards 51 and 52 in place of the elastomeric connectors 72.

Of course, it is important that the individual circuits are not short circuited relative to each other, so that the insulation used is adequate to prevent such short circuiting.

The effect of the present invention is to double the mother burn-in board surface area available for conductors, components and burn-in sockets while making use of the increased nose board connectors available (for example 512 connectors) with two nose boards on one burn-in board assembly or module.

It also would be possible to mount two or more double burn-in board modules together and parallel connect all burn-in board conductors so long as there was access to the burn-in sockets on the mother boards.

This could be done by hinging the double burn-in board modules together so they could be opened for access to the interior burn-in sockets.

Although the present invention has been described with reference to preferred embodiments, workers skilled in the art will recognize that changes may be made in form and detail without departing from the spirit and scope of the invention.

What is claimed is:

1. A burn-in board assembly comprising a pair of mother boards placed back to back, each of said mother boards having a plurality of burn-in sockets for mounting components to be burned in, separate conductors and connectors on each mother board for providing connection from the burn-in sockets to external driver/receiver components, and means for connecting individual conductors on each of the mother boards to the corresponding conductors on the other mother board in parallel such that one set of driver/receiver components provides signals to both mother boards, and spacer means along top and bottom edges of said mother boards for holding said mother boards in a spaced relationship at such edges, said connectors being along one edge of such boards extending between the top and bottom edges, and electrically conductive spacer means connecting selected conductors on each of the mother boards to the other mother board for carrying electrical signals between the mother boards.

2. The assembly as specified in claim 1 wherein said burn-in board assembly has edge guide rails mounted on the outer sides of the top and bottom edges thereof for providing support for the burn-in board assembly.

3. The burn-in board assembly of claim 1 and a plurality of legs extending from the burn-in board assembly in opposite lateral directions therefrom to provide for supporting outer side surfaces of the board spaced from a supporting surface when the board assembly is placed laterally on its supporting surface.

4. The assembly as specified in claim 3, wherein said legs are triangular shaped with a hypothenuse surface, and the legs at an upper edge of the burn-in board assembly on one side thereof have the hypothenuse surfaces of the triangle extending out and downwardly from the burn-in board, and the legs on the outer side of the other burn-in board of the assembly have the hypothenuse of the triangle extending outwardly and upwardly, whereby the legs of adjacent burn-in board assemblies can be slid past each other when installed in an environmental chamber.

5. A double burn-in board assembly comprising a pair of mother boards placed back to back and adapted to provide for mounting of electrical components thereon, said mother boards each having a plurality of conductors thereon which can be connected to components to be tested, means to support said mother boards in a spaced apart relationship, means to connect least selected conductors on one mother board in parallel with corresponding conductors on the other mother board; a separate nose board mounted with respect to each of said mother boards, said nose boards having conductors thereon adapted to be connected to test equipment, and each of the conductors on the nose board being connected to selected conductors of the mother board on which it is mounted, whereby a signal present in each conductor on each nose board is available to parallel connected conductors on the respective mother boards.

6. The burn-in board assembly of claim 5 and spacer means for holding said mother boards in spaced apart relationship to form a rigid assembly.

7. The burn-in board assembly as specified in claim 5 and a non-conductive pad positioned between said mother boards in center of portions thereof.

8. The burn-in board assembly of claim 5, wherein said means for connecting conductors on the two mother boards in parallel comprises at least one resilient strip connector having a plurality of individual wires for contacting conductors on each of the mother boards, said wires being insulated from each other and held in an insulating material, and a spacer along a connector edge of the mother boards, said spacer having a slot therein for receiving and holding the resilient connector, whereby when the mother boards are clamped against the spacer, the resilient connectors will compress slightly to make contact.

* * * * *